(12) United States Patent
Koller et al.

(10) Patent No.: US 7,304,534 B2
(45) Date of Patent: Dec. 4, 2007

(54) AMPLIFIER ARRANGEMENT, AND METHOD FOR COMPENSATING FOR AN OFFSET

(75) Inventors: Rainer Koller, Linz (AT); Thomas Wagenleitner, Aurolzmünster (AT); Varol Mutlu, Blaustein (DE)

(73) Assignee: Infineon Technologies AG, Munich (DE)

( * ) Notice: Subject to any disclaimer, the term of this patent is extended or adjusted under 35 U.S.C. 154(b) by 110 days.

(21) Appl. No.: 11/350,224

(22) Filed: Feb. 8, 2006

(65) Prior Publication Data

US 2006/0186954 A1     Aug. 24, 2006

(30) Foreign Application Priority Data

Feb. 18, 2005   (DE)  .................. 10 2005 007 632

(51) Int. Cl.
  *H03F 1/02* (2006.01)
(52) U.S. Cl. ............................. 330/9; 330/51
(58) Field of Classification Search .................... 330/9, 330/51, 149; 327/124, 307
  See application file for complete search history.

(56) References Cited

U.S. PATENT DOCUMENTS 4,490,682 A    12/1984  Poulo 5,764,103 A *   6/1998  Burra et al. .................. 330/51
6,756,842 B2 *  6/2004  Mehr et al. .................... 330/9
7,005,916 B2 *  2/2006  Nakahira et al. ............... 330/9

FOREIGN PATENT DOCUMENTS

GB        2 215 931 A    9/1989

\* cited by examiner

*Primary Examiner*—Henry Choe
(74) *Attorney, Agent, or Firm*—Eschweiler & Associates, LLC (57) ABSTRACT

An amplifier arrangement and a method for compensating for an offset in an amplifier is provided. A respective switch for connecting together the inputs in a compensation operating mode and for interrupting the feedback path in this operating mode is provided in an amplifier. A control device detects an output signal and drives a controllable current source, which can be coupled to one of the two inputs of the amplifier, in such a manner that a compensation current which minimizes the offset is provided. The arrangement and method can be used, for example, in transmission arrangements.

20 Claims, 4 Drawing Sheets

AMPLIFIER ARRANGEMENT, AND METHOD FOR COMPENSATING FOR AN OFFSET

REFERENCE TO RELATED APPLICATIONS

This application claims the benefit of the priority date of German application DE 10 2005 007 632.7, filed on Feb. 18, 2005, the contents of which are herein incorporated by reference in their entirety.

FIELD OF THE INVENTION

The present invention relates to an amplifier arrangement, to the use thereof, and to a method for compensating for an offset in an amplifier.

BACKGROUND OF THE INVENTION

Offsets may have different causes in a signal processing chain of an integrated circuit. Fluctuations in the supply voltage, temperature drift effects, fluctuations in process parameters during fabrication and matching problems between electronic components in the case of differential signal routing thus contribute, for example, to the occurrence of offsets.

Such direct current (DC) offsets may have undesirable effects in transmission arrangements, for example. DC offsets which occur in the baseband signal processing system of a transmitter thus result in a sinusoidal signal at the respective transmission frequency at the output of the modulator. This significantly increases error vectors in digital modulation methods. It is therefore desirable to be able to compensate for such DC offsets.

It is possible to reduce the DC offsets by introducing a compensation signal, which compensates for the offset, at the input of the baseband signal processing system of a transmission arrangement. This may be carried out, for example, when fabricating mobile radios. In this case, the compensation voltage (which is respectively needed for the purpose of compensation) for each individual device may be stored in a nonvolatile memory of the baseband chip. In the reception path of a mobile radio, a DC offset may even result in system failure since the extremely high gain in the analog baseband may result in transient spikes which may drive individual stages of the signal processing chain into saturation and may result in analog/digital converters being overdriven.

It goes without saying that DC offsets may be avoided using AC coupling, that is to say a high-pass filter having a low cut-off frequency. However, such AC coupling requires a relatively large chip area on account of the series capacitances which are normally provided for implementation. In addition, information components of useful information may be removed or filtered out in an undesirable manner.

Code division multiple access (CDMA) methods which operate in a continuous-time mode are used in modern mobile radio methods, for example the so-called Universal Mobile Telecommunications System (UMTS). Accordingly, it is not possible, in contrast to earlier mobile radio methods, for example GSM (Global System for Mobile Communication), which operate using time division multiple access, to periodically interrupt the signal chain in order to be able to carry out calibrations during transmission operation.

DC feedback affords another possible way of compensating for DC offsets. However, this principle has the disadvantage that a relatively low cut-off frequency of the highpass filter is required in order to avoid the useful signal being excessively distorted. However, this means that the transient response time becomes relatively long, which, in turn, has adverse effects on the received signal. Another disadvantage results from transients which may occur when there is a sudden change in the gain, even in the case of high-pass filters which settle more rapidly, and may exceed the useful signal many times over. The analog/digital converter thus cannot be controlled in an ideal manner. In particular, the switching transients which have been mentioned and occur when the gain value is changed in the reception path of a transmission/reception unit result in considerably impaired electrical properties of the receiver.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to an amplifier arrangement and a method for compensating for an offset in an amplifier arrangement. The arrangement and method, on account of their accuracy, are suitable for methods which operate in a continuous-time mode and for use in mobile radios.

In one embodiment of the invention, the amplifier arrangement comprises an amplifier with two inputs and an output, and a feedback path that couples the output to at least one of the two inputs. The arrangement further comprises a first switch configured to couple the two inputs to one another, such that they can be switched in a compensation operating mode, and a second switch configured to interrupt the feedback path in the compensation operating mode. The arrangement also includes a controllable current source coupled to at least one of the two inputs of the amplifier, and a control device configured to couple the output of the amplifier to the controllable current source in order to reduce an offset at the inputs of the amplifier in the compensation operating mode by providing a compensation current.

In another embodiment of the invention, a method for compensating for an offset in an amplifier comprises interrupting a feedback path of the amplifier from an output to at least one input of the amplifier, and coupling two inputs of the amplifier to one another. The method further comprises detecting an output signal from the amplifier, and providing a controllable compensation current at one of the inputs of the amplifier on the basis of the detected output signal.

In accordance with the invention, DC offsets at the input of the amplifier are compensated for by adding a correction current at the input of the amplifier. In this case, the inputs of the amplifier are connected to one another during calibration or compensation. During the compensation operating mode, the amplifier is operated without an external connection, namely with the feedback path interrupted. This is also referred to as open-loop operation of an amplifier. If there is an offset, the output of the amplifier tilts toward the positive or negative supply voltage of the amplifier, depending on the polarity of the offset. This property is used to determine the suitable compensation signal. A DC offset at the input of the amplifier can thus be avoided or at least considerably reduced.

Since it is only necessary to detect the output signal from the amplifier in order to determine whether the signal corresponds to the supply potential or to the reference potential, compensation can be carried out with particularly little complexity.

In one example the correction current is generated using a number of "n" weighted current sources, beginning with the largest current source which is controlled by the most significant bit (MSB) down to the smallest current source which is controlled by the least significant bit (LSB). Depending on accuracy, this is effected with a resolution of "n" bits.

Successive approximation is carried out as an iterative method in one example of the invention.

A flipping of the output voltage of the amplifier from the supply potential to the reference potential of the amplifier or vice versa indicates that the optimum correction current has been exceeded. That correction current which was impressed one iteration step beforehand therefore represents or is associated with the intrinsic offset of the amplifier for this bit. The method is then repeated for the next, less significant bit, that is to say using the next current source with a lower weighting.

In order to dimension the maximum correction current which needs to be determined in an initial simulation in order to compensate for an offset, the amplifier is regarded as being connected. If an adjustable gain is provided, the maximum gain is taken as a basis. On account of the high gain during open-loop operation, linear operation is not employed.

If a plurality of amplifiers are provided in a circuit, for example in a transceiver, the compensation operations described can be carried out concurrently, e.g., in parallel, for each operational amplifier. This is made possible by the fact that the inputs of each amplifier are short-circuited in one example and the outputs are disconnected anyway. Adjusting the amplifiers but not the individual programming positions makes it possible to considerably reduce the complexity. Therefore the amplifier itself and not its external connection is evaluated for the offset.

The amplifier in one example is an operational amplifier. Alternatively or additionally, the amplifier may be a differential amplifier.

In one example the amplifier arrangement described is used in a transmission path and/or a reception path of a transmission and reception unit.

By way of example, the amplifier arrangement may be respectively provided in the in-phase path and in the quadrature path at the input of a radio frequency module of a transmission arrangement.

If the input-side short-circuiting of the inputs of the operational amplifier is not effected directly at the input but rather at the input of an upstream stage, for example a baseband block, the entire baseband block may be advantageously concomitantly adjusted, or one or more other upstream stages may be concomitantly adjusted. This condition may be taken into account when dimensioning the adjustment range of the controllable current source.

In one embodiment the controllable current source comprises a plurality of current sources which are connected and disconnected independently of one another. In such an example, the current sources are graduated in binary fashion.

In addition, instead of the successive approximation method, it is also possible to use another method, for example a counting method or a weighing method, depending on the application in accordance with the invention.

Both area-intensive AC coupling and DC feedback can be dispensed with as a result of the compensation in accordance with the invention.

In one example a memory is employed to store the programming (which is determined during compensation operation) of the plurality of current sources for subsequent normal operation.

The compensation in accordance with the invention is accurate enough to significantly improve operation of the amplifier arrangement despite being carried out once, for example when the mobile radio which comprises said amplifier arrangement is switched on. The primary factors of influence for a DC offset are dictated typically by the technology and are dependent on matching of the components and are not primarily caused by temperature and/or drift effects or by supply voltage fluctuations. The DC offset at the input of an amplifier can thus be considerably reduced in accordance with the invention.

Yet another reduction in the DC offset can be achieved by means of combination with a DC feedback loop of the amplifier arrangement. This makes it possible to increase the compensation accuracy and thus to further reduce its execution speed and implementation complexity. Transients which interfere with the system are nevertheless reduced to a negligible level.

According to one or more aspects of the present invention, the control circuit comprises a signal input for disconnection. This signal input is connected to the circuit, with the circuit in the active operating state being designed to output a disconnection signal to the control circuit. This reduces the power consumption of the control circuit, since said control circuit is no longer required during the active operating state.

BRIEF DESCRIPTION OF THE DRAWINGS

The invention will be explained in more detail below using a plurality of exemplary embodiments and with reference to drawings, in which.

DETAILED DESCRIPTION OF THE INVENTION

Figure 1:
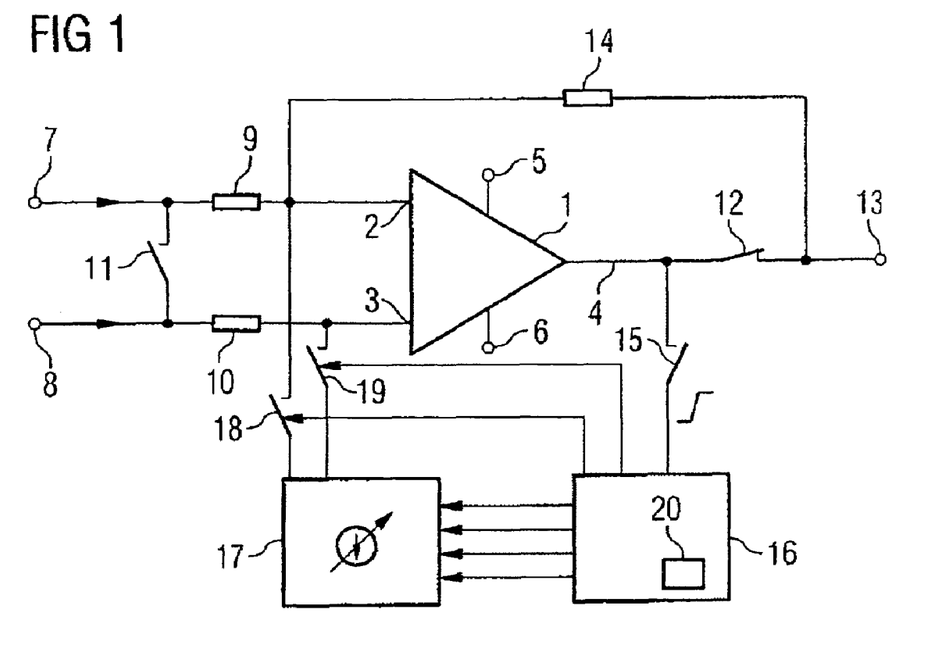
FIG. 1 is a circuit diagram illustrating a first exemplary embodiment of an amplifier arrangement according to the invention.

FIG. 1 shows an operational amplifier 1 having a first input 2, a second input 3 and an output 4. In addition, provision is made of respective connections 5, 6 for supplying a supply potential and a reference potential for the operational amplifier 1. A differential input 7, 8 of the arrangement is coupled to the inputs 2, 3 of the operational amplifier via a respective resistor 9, 10. A switch 11 which is in the form of a normally open contact is connected between the terminals 7, 8 of the differential input in order to selectively short-circuit the inputs 2, 3 of the operational amplifier in a compensation operating mode of the operational amplifier. In this case, the inputs 2, 3 are connected to one another via the series circuit comprising the resistors 9, 10. The output 4 of the operational amplifier is coupled selectively to an output 13 of the amplifier arrangement via a switch 12 which is in the form of a normally closed contact.

The output 13 of the arrangement is connected to the first input 2 of the operational amplifier 1 in a feedback path. The feedback path has an impedance which, in the present example, is in the form of a resistor 14. The output 4 of the operational amplifier 1 also is connected selectively to a control device 16 via a switch 15 which is in the form of a normally open contact. The switch 12 for interrupting the feedback path and the switch 15 are likewise provided for activation in the compensation operating mode. A controllable current source 17 is connected to a plurality of outputs of the control device 16. An output of the controllable current source 17 is connected to each of the two inputs 2, 3 of the operational amplifier 1 via a respective switch 18, 19. In order to be driven, the switches 18, 19 are coupled to the control device 16 in such a manner that the controllable current source 17 selectively emits a controlled current to the input 2 or to the input 3 of the operational amplifier.

The control device 16 is configured to compensate for an offset at the differential input 7, 8 of the amplifier arrangement. In the compensation operating mode, the switch 11 is closed in order to short-circuit the inputs of the operational amplifier 1. At the same time, the switch 12 at the output is opened, so that the feedback path is interrupted and the amplifier is in open-loop operation. In addition, in the compensation operating mode, the control device 16 is connected to the output 4 via the switch 15. In contrast, during normal operation, the switches 11, 12, 15 are in the switch position shown.

In the present example, the control device 16 is configured to carry out compensation in accordance with a successive approximation method. Since the differential inputs 2, 3 of the operational amplifier are short-circuited, the output 4 tilts either to the supply voltage or to the reference potential, namely one of the potentials (which are supplied to the inputs 5, 6) of the voltage supply for the operational amplifier 1, depending on the polarity and magnitude of the offset at the input. The offset is compensated for by adding a correction current at the input 2, 3 of the operational amplifier.

The controllable current source supplies the correction current, in a controllable manner, to the first or second input 2, 3 of the operational amplifier 1 depending on the polarity of the offset. When the correction current is generated in discrete steps, for example, in graduated, binary fashion, the requisite correction current is successively approximated, with a resolution of "n" bits, using a corresponding number of "n" weighted current sources, beginning with the largest current source which is controlled by the bit having the greatest significance (MSB (most significant bit)). Flipping of the output voltage at the output 4 from the supply potential to the reference potential indicates that the optimum correction current has been exceeded. In one example the current which was impressed one step beforehand for this bit is thus determined since said current represents or is associated with the intrinsic offset of the operational amplifier for this resolution. The method is then repeated for the next bit, that is to say the bit for the next current source with a lower weighting. This results in a correction current which is provided within the resolution accuracy, as defined by the bit having the least significant resolution (LSB (least significant bit)). In this example, the controllable current source 17 comprises the weighted current sources.

In one example the control device 16 comprises a memory for storing the compensation information, namely the "n" bits for programming the controllable current source 17. During normal operation which follows compensation operation, the information regarding the generation of the correction current, both in terms of the magnitude and in terms of the selection of the noninverting or inverting input 2, 3 of the operational amplifier, is thus available. During normal operation, the determined correction current is superimposed on a useful signal (which can be supplied to the inputs 2, 3 of the operational amplifier) in a manner that compensates for the offset.

In order to dimension the maximum correction current needed, that is to say the maximum offset which occurs, in one example, the operational amplifier is regarded as being connected since linear operation is not possible on account of the high open-loop gain.

If a plurality of operational amplifiers 1 are provided, it is possible, on account of the disconnection at the input and output, to adjust the plurality of operational amplifiers in parallel without any problems in a common integrated circuit.

Since offsets in amplifiers often are generated and caused by transistor matching problems in the symmetrical signal paths and by process fluctuations, the invention compensation with a high degree of precision and accuracy even when compensation is carried out once, for example when the system which comprises the amplifier is switched on.

The proposed amplifier arrangement is thus particularly suited to use in those circuits which are intended to process a continuous data stream without interruption and with a small offset. This is the case, for example, in modern mobile radio methods which use Code Division Multiple Access (abbreviated to CDMA) methods. The circuit arrangement described is thus particularly suited to the offset calibration of amplifiers in the baseband and radio frequency signal processing chain of transmission and reception paths in transceivers of mobile radios.

In one embodiment of the invention there is no need for any additional AC coupling or similar means in order to compensate for an offset. Nevertheless, depending on the application, other measures such as AC coupling or a DC feedback loop may be combined with the invention.

Accurate offset compensation leads to the avoidance of problems such as the carrier frequency showing through at the output of a transmitter. Problems of transient spikes and saturation, which are typically caused by DC offsets and can give rise to overdriving, are avoided in the reception path.

The proposed amplifier arrangement of the invention is also distinguished by the simple determination of whether or not a bit of a particular current source is to be set, since flipping of the output 4 from the supply voltage to the reference potential or vice versa can be detected in a very simple manner, and the signal to be detected is practically already present in the form of a digital signal at the output 4 during the compensation operation.

The invention may be executed fully automatically in one embodiment, for example by triggering with a signal when starting up the system which comprises the amplifier arrangement, with the result that any manual steps are dispensed with.

Figure 2:
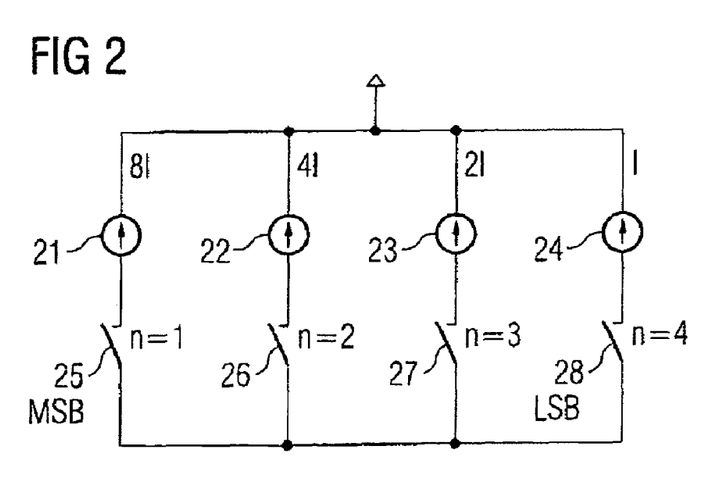
FIG. 2 is a circuit diagram illustrating a programmable current source (in the form of a controllable current source) which has been weighted in binary fashion according to an aspect of the invention.

FIG. 2 shows an example of a controlled current source according to one embodiment that comprises a plurality of current sources 21, 22, 23, 24 which are connected in parallel and are graduated in binary fashion. In this case, the largest current source 21 provides eight times the current 8I provided by the smallest current source 24. Accordingly, the largest current source 21 is controlled using the most significant bit (MSB), while the smallest current source 24 is driven using the LSB (least significant bit). For this purpose, each current source 21 to 24 is connected in series with a respective switch 25, 26, 27, 28. The current sources in between provide twice and four times the current 2I, 4I (with regard to their weighting) of the smallest current source 24 controlled by the least significant bit. As proposed, the compensation current is determined, in accordance with successive approximation, from the bit with the highest weighting to the bit with the lowest weighting, that is to say from the current sources 21 to 24. A resolution of n=4 bits is provided in this example, however, other resolutions may be employed.

In addition, in alternative designs, other weightings and other methods for compensating for the offset are also possible, depending on the application.

Figure 3:
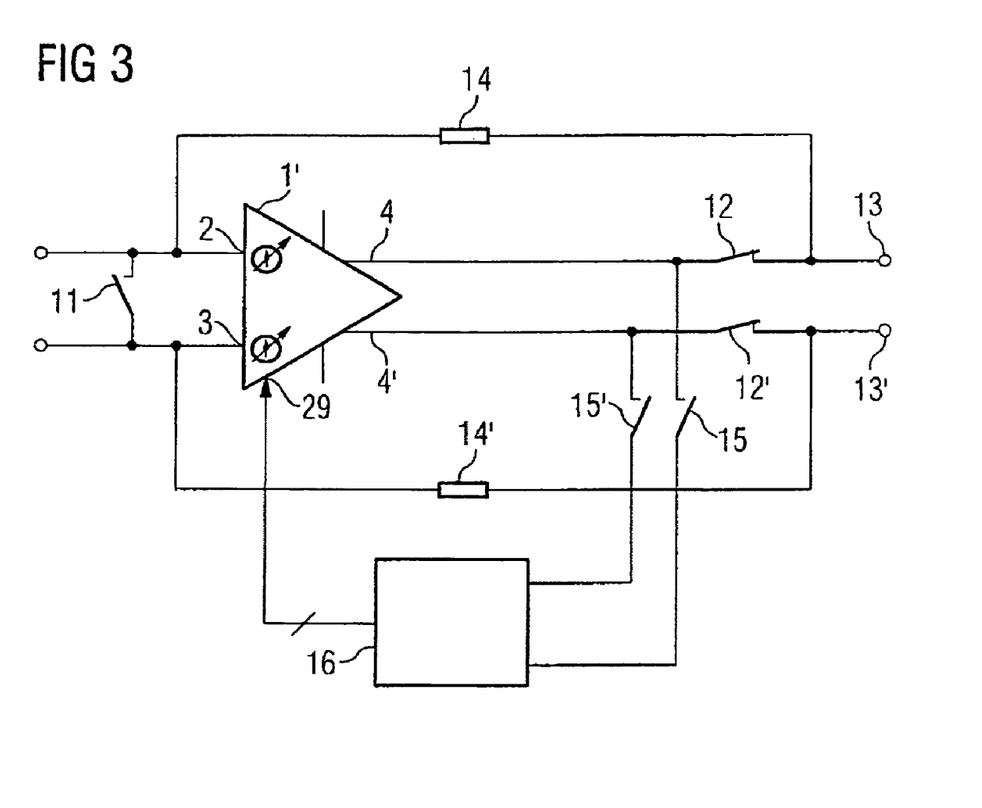
FIG. 3 is a circuit diagram illustrating a second exemplary embodiment of an amplifier arrangement according to the invention.

FIG. 3 shows another exemplary embodiment of an amplifier arrangement according to the invention in a modification of the circuit shown in FIG. 1, wherein the controlled current source is not externally provided, but rather is internally accommodated within the operational amplifier. The circuit shown in FIG. 3 largely corresponds, in terms of the components used, the design and the advantageous method of operation, to that shown in FIG. 1 and, in this respect, it is not repeated again. However, in contrast to FIG. 1, a control input 29 is formed at the operational amplifier 1 in FIG. 3, said control input being connected to an output of the control device 16 in order to control the internal controlled current sources. The controlled current source still acts on an input 2, 3 of the operational amplifier as discussed above.

Furthermore, in contrast to FIG. 1, a fully differential design of the signal path is provided in FIG. 3 in such a manner that the output of the operational amplifier 4, 4' is also designed to route differential signals and is coupled to the output 13, 13' via a respective switch 12, 12'. The two connections of the output 4, 4' are also correspondingly connected to a respective input of the control device 16 via a respective switch 15, 15'. The feedback path is also of differential design, namely with a respective resistor 14, 14' between the output 13, 13' and the inputs 2, 3 of the operational amplifier. The resistors 9, 10 have been replaced with short circuits.

As for the amplifier arrangement shown in FIG. 1, it holds true for the amplifier arrangement shown in FIG. 3 that the correction current is impressed either at the input 2 or at the input 3 of the operational amplifier 1 under the control of the control device 16.

In alternative embodiments, the features shown by way of example using FIGS. 1 and 3 may also be combined differently with one another in any desired manner without departing from the scope of the invention.

Figure 4:
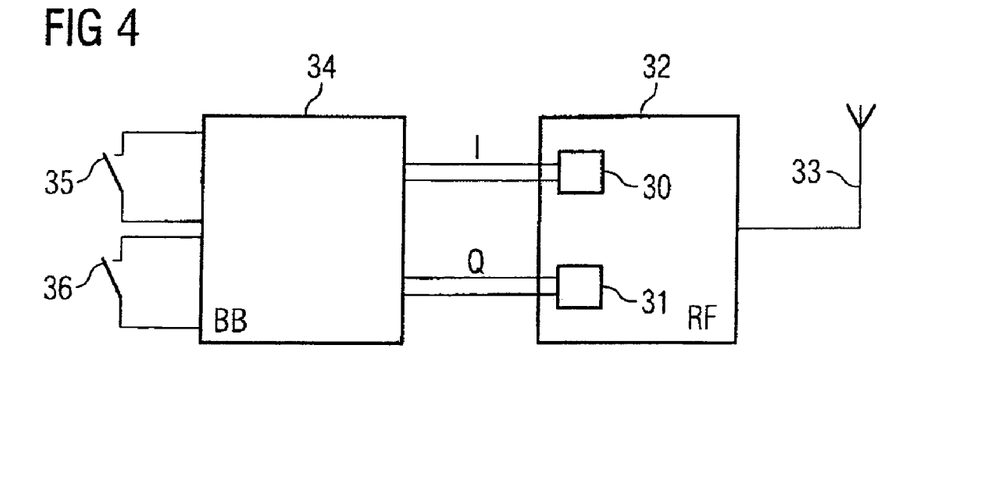
FIG. 4 is a block diagram illustrating, by way of example, one use of the amplifier arrangement according to the invention in a transmission arrangement.

FIG. 4 uses an exemplary embodiment to show one use of an amplifier arrangement (as described by way of example in accordance with FIGS. 1 and 3) in a transmission path of a mobile radio. In this case, a respective amplifier arrangement 30, 31 according to the proposed principle is arranged at the in-phase input I and at the quadrature input Q of a radio frequency module 32. The output of the radio frequency module 32 is coupled to an antenna 33 via a power amplifier (not depicted). The in-phase and quadrature inputs I, Q of the radio frequency module 32 are coupled to a respective corresponding output of a baseband module 34. In the present case, the in-phase and quadrature paths are each designed to route differential signals.

In the example shown in FIG. 4, it is advantageously not only possible to compensate for an offset at the input of the amplifiers 30, 31 but also to concomitantly adjust for the entire baseband module 34 as regards any offsets which may be present. For this purpose, switches 35, 36 are provided at the input of the baseband module, which switches can be used to short-circuit the amplifier inputs in the radio frequency module over the entire baseband signal path in the compensation operating mode. It goes without saying that additional or fewer functional units may also be concomitantly included in offset compensation. The switches may be integrated in the baseband module 34 in one example.

It goes without saying that the proposed measure of compensating for the offset in further functional blocks which are connected to the input of the amplifier can also be applied, within the scope of the invention, to other systems as transmission paths of transceivers, for example.

Figure 5:
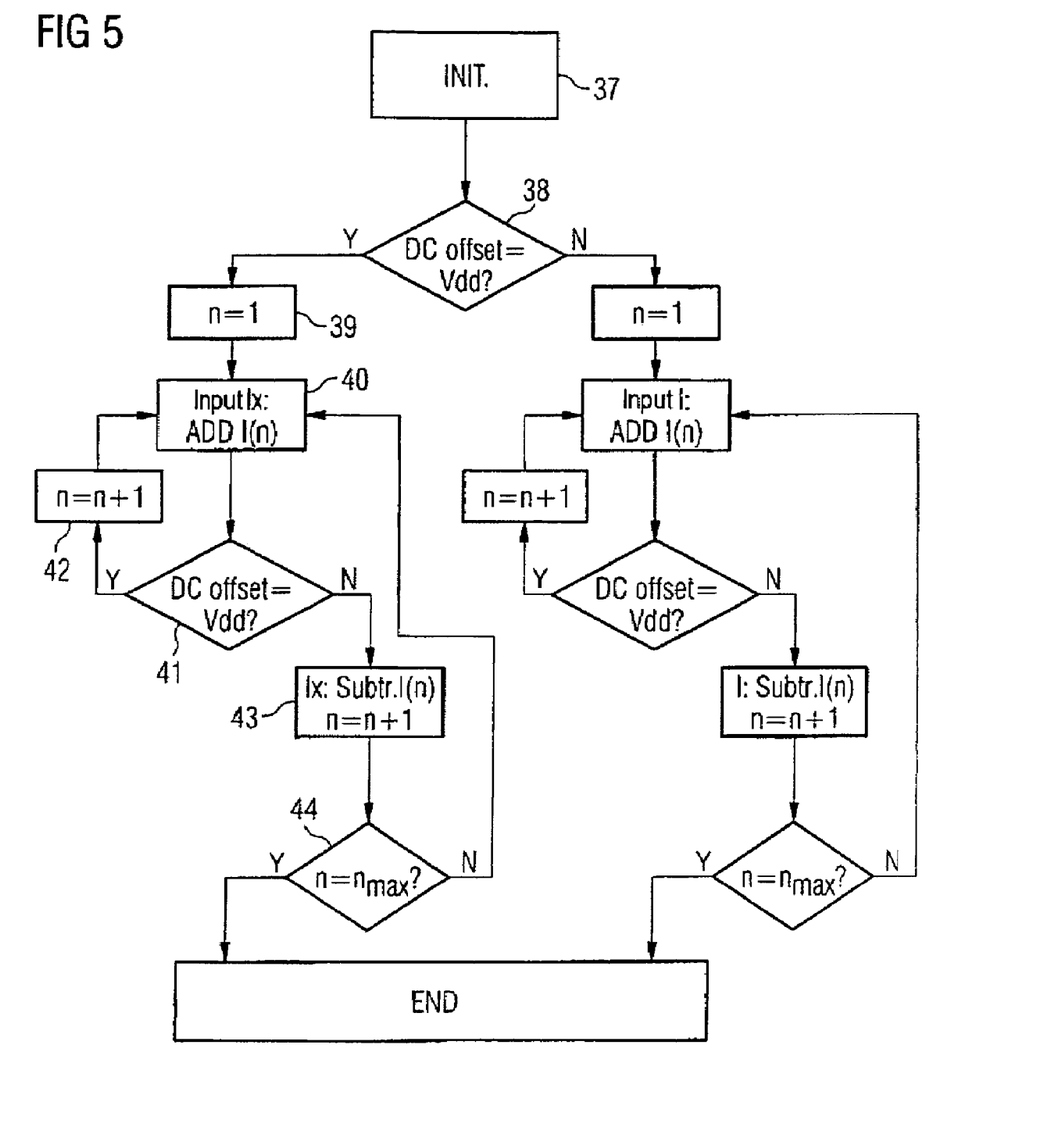
FIG. 5 is a flowchart illustrating a method for compensating for the offset in an amplifier according to another embodiment of the invention.

FIG. 5 shows one example of a method for determining the respective suitable compensation current for compensating for an offset in an amplifier arrangement according to the proposed principle. This method may be implemented, for example, in the control devices 16 shown in FIGS. 1 and 3 and may be used to control a programmable current source as shown in FIG. 2.

While the method and other methods of the invention are illustrated and described below as a series of acts or events, it will be appreciated that the invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

In an initialization at 37, the feedback path of the amplifier 1 is first of all interrupted and a short circuit is formed between the inputs 2 and 3 of the operational amplifier. The potential at the output of the operational amplifier is then checked in a comparison at 38. in order to determine whether or not it corresponds to the supply potential at the supply voltage input 5. If so (Y), the count n is set to 1 at 39 and, at the inverting input of the operational amplifier, a partial current I of n (n=1 in the present case) is added to the inverting input of the amplifier at 40. The output voltage of the amplifier is then compared again with the supply voltage in a comparison at 41. If the result is the same as before (Y), the index n is incremented by 1 (act 42) and the process then continues at 40. If not (N at 41), a partial current I(n) is subtracted from the inverting input and the index n is likewise incremented by 1 at 43. If the largest bit n has been reached (which is checked at 44), compensation is ended but, if not, the process again continues at step 40 in which a partial current I(n) is added to the inverting input and the output potential is then compared with the supply potential. An analogous method results for the noninverting input of the amplifier if, after initialization at 37 and comparison at

38, the comparison result which indicates that the output voltage of the amplifier is not equal to the supply potential is provided.

This method corresponds to implementation of the successive approximation method for current sources which are weighted in binary fashion. It goes without saying that other approximation methods and other weightings are also possible, within the scope of the invention, when generating the correction currents, depending on the application.

Figure 6:
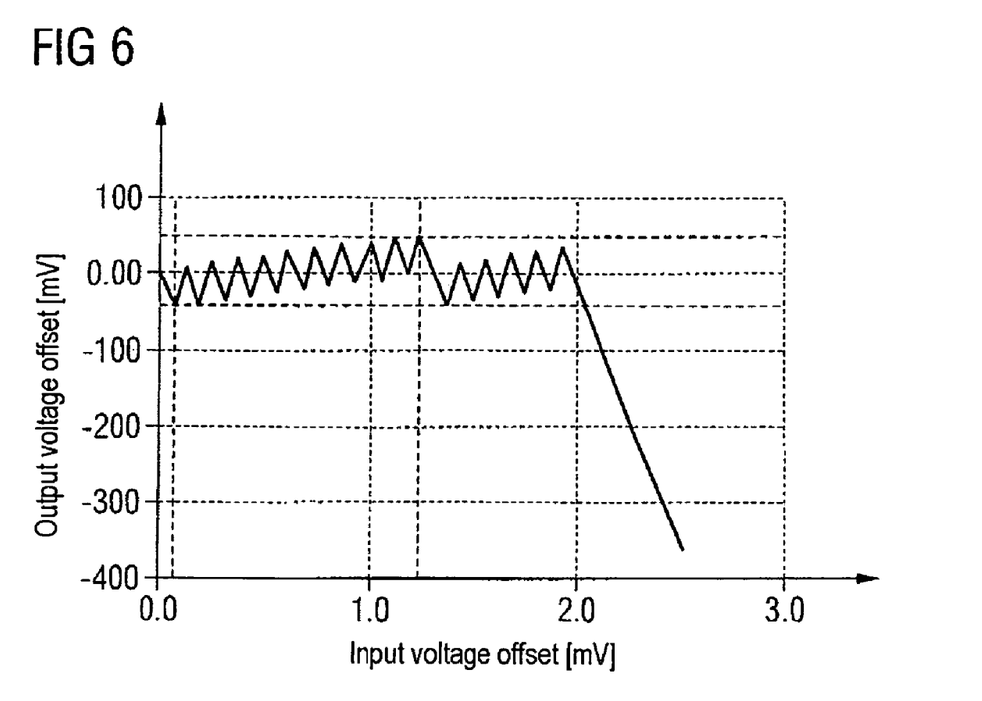
FIG. 6 is a graph illustrating, by way of example, the output voltage offset against the input voltage offset in an amplifier according to the invention.

FIG. 6 is an exemplary graph illustrating the output voltage offset in volts plotted against the input voltage offset in volts in an amplifier according to the invention. In this case, the graph also shows the compensation limit which can be derived from the respective offset voltage at the output. It can be seen that input offsets of up to 2.1 mV can be corrected using the current source weighting selected in the present case (namely binary) and the exemplary number of current sources, namely 4. In the illustration shown, the maximum possible correction current was selected in such a manner that, in the case of random distribution, the 3-sigma offset current at the differential pair of inputs of the operational amplifier, whose effect corresponds to a voltage at the input of 2.1 mV, can only just be corrected. If this range is exceeded, the remaining residual error also becomes larger. This relationship is explained below with reference to FIG. 7.

Figure 7:
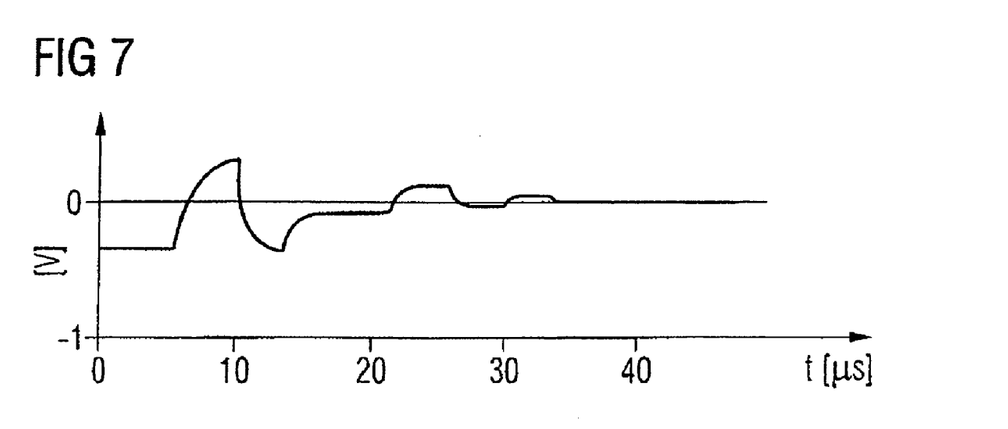
FIG. 7 is a graph illustrating exemplary characteristic curves to show the temporal profile of the compensation behavior at the output on the basis of the offset voltages at the input.

FIG. 7 shows, by way of example, a profile of an input offset voltage. In the graph, the resulting offset which converges toward zero is plotted against time. Within prescribed limits, the offset at the output is corrected using an error whose magnitude is smaller than that current which is provided by the source 24 having the least significant bit. This maximum error is likewise dependent on the number of current sources and thus on the number n of bits and can therefore also be reduced even further by increasing the number of current sources and the number of bits.

Although the invention has been illustrated and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

The invention claimed is:

1. An amplifier arrangement, comprising:
    an amplifier comprising two inputs and an output;
    a feedback path coupled between the output and at least one of the two inputs;
    a first switch configured to selectively couple the two inputs to one another in a compensation operating mode;
    a second switch configured to selectively interrupt the feedback path in the compensation operating mode;
    a controllable current source coupled to at least one of the two inputs of the amplifier; and
    a control device configured to control the first and second switches and the controllable current source in the compensation operating mode based on the output of the amplifier to reduce an offset at the inputs of the amplifier by providing a compensation current via the controllable current source to the at least one of the two inputs.

2. The amplifier arrangement of claim 1, wherein the controllable current source comprises a plurality of current sources coupled together in parallel that are configured to be selectively connected and disconnected independently of one another based on the control device.

3. The amplifier arrangement of claim 1, wherein controllable current source comprises a plurality of current sources coupled together in parallel that are configured to be selectively connected and disconnected independently of one another based on the control device, and wherein the plurality of current sources provide current values that are graduated in binary fashion.

4. The amplifier arrangement of claim 1, wherein the controllable current source is integral within the amplifier.

5. The amplifier arrangement of claim 1, further comprising another controllable current source coupled to the other input of the amplifier, and to the control device, and configured to generate a compensation current based on the control device.

6. The amplifier arrangement of claim 1, wherein the control device is configured to reduce the offset by means of altering a current produced by the controllable current source iteratively via successive approximation.

7. The amplifier arrangement of claim 1, wherein the amplifier comprises a supply potential connection and a reference potential connection.

8. The amplifier arrangement of claim 1, wherein the amplifier comprises a differential amplifier.

9. The amplifier arrangement of claim 1, wherein the amplifier comprises an operational amplifier.

10. The amplifier arrangement of claim 1, wherein the amplifier is connected to one or more additional components in the feedback path to form a filter.

11. A method for compensating for an offset in an amplifier, comprising:
    interrupting a feedback path of the amplifier from an output to at least one input of the amplifier;
    coupling two inputs of the amplifier to one another;
    detecting an output signal from the amplifier indicative of the offset; and
    providing a controllable compensation current at one of the inputs of the amplifier based on the detected output signal.

12. The method of claim 11, wherein the controllable compensation current is adjusted iteratively via successive approximation.

13. The method of claim 11, wherein detecting the output signal from the amplifier comprises determining whether the output signal corresponds to a supply potential or to a reference potential associated with the amplifier.

14. The method of claim 11, wherein detecting the output signal from the amplifier comprises detecting a change in the output signal between a supply potential and a reference potential.

15. The method of claim 11, wherein coupling the two inputs of the amplifier to one another comprises coupling together input terminals of a functional block upstream of the amplifier in order to compensate for an offset in the amplifier and the upstream functional. block.

16. A communications transmission arrangement, comprising:
a baseband module configured to generate in-phase and quadrature signals associated with a desired communication transmission;
a radio frequency module configured to receive the in-phase and quadrature signals, and transform such signals into a radio frequency transmission signal, the radio frequency module comprising an amplifier arrangement at an input thereof associated with the in-phase and quadrature signals, respectively;
input switches configured to selectively short one or more inputs associated with either the baseband module or the radio frequency module during a compensation mode;
a control device configured to close the input switches, place the amplifier arrangement into an open-loop configuration, and evaluate an output condition of the amplifier arrangement during the compensation mode;
a controllable current source configured to provide a variable compensation current to the amplifier arrangement to reduce an offset thereof based on the control device in the compensation mode.

17. The transmission arrangement of claim 16, wherein the controllable current source comprises a plurality of current sources selectively coupled together in parallel based on the control device, thereby configured to selectively provide a plurality of different current values.

18. The transmission arrangement of claim 17, wherein the control device is configured to iteratively alter an amount of current associated with the controllable current source until an output condition of the amplifier arrangement changes in the compensation mode.

19. The transmission arrangement of claim 18, further comprising a memory configured to store an offset current compensation value, and wherein the control device is further configured to ascertain the offset current compensation value based on the output of the amplifier arrangement after multiple iterations in the compensation mode, and send the ascertained offset current compensation value to the memory in the compensation mode.

20. The transmission arrangement of claim 19, wherein the control device is further configured to retrieve the offset current compensation value from the memory, and employ the value to control the controllable current source during a normal signal transmission mode.

* * * * *